(12) United States Patent
Chen

(10) Patent No.: US 10,706,832 B2
(45) Date of Patent: Jul. 7, 2020

(54) NOISE REDUCTION DEVICE AND PRINTED CIRCUIT ASSEMBLY INCLUDING THE SAME

(71) Applicants: INVENTEC (PUDONG) TECHNOLOGY CORPORATION, Shanghai (CN); INVENTEC CORPORATION, Taipei (TW)

(72) Inventor: Mu-Chi Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 419 days.

(21) Appl. No.: 15/866,366

(22) Filed: Jan. 9, 2018

(65) Prior Publication Data

US 2019/0005939 A1 Jan. 3, 2019

(30) Foreign Application Priority Data

Jul. 3, 2017 (CN) .......................... 2017 1 0532162

(51) Int. Cl.
*H05K 9/00* (2006.01)
*G10K 11/175* (2006.01)
*H05K 1/02* (2006.01)
*H05K 3/36* (2006.01)

(52) U.S. Cl.
CPC ........... *G10K 11/175* (2013.01); *H05K 1/023* (2013.01); *H05K 1/0215* (2013.01); *H05K 1/0233* (2013.01); *H05K 9/0024* (2013.01); *H05K 3/365* (2013.01); *H05K 2201/0355* (2013.01); *H05K 2201/0715* (2013.01); *H05K 2201/083* (2013.01); *H05K 2201/10075* (2013.01); *H05K 2201/10371* (2013.01); *H05K 2201/10409* (2013.01)

(58) Field of Classification Search
CPC .................... H05K 2201/0715; H05K 9/0024
See application file for complete search history.

(56) References Cited

U.S. PATENT DOCUMENTS

| 5,436,803 | A | * | 7/1995 | Annis | ................... | H05K 9/0043 361/818 |
| 5,475,606 | A | * | 12/1995 | Muyshondt | .......... | H05K 1/0218 174/257 |

(Continued)

*Primary Examiner* — Hung V Ngo
(74) *Attorney, Agent, or Firm* — Maschoff Brennan

(57) ABSTRACT

A printed circuit assembly includes a printed circuit board, a processor, an oscillator and a noise reduction device. The printed circuit board has a ground connecting portion. The processor is disposed on the printed circuit board. The oscillator is disposed on the printed circuit board. The noise reduction device includes a wave absorber, a blocking sheet and an electrically conductive member. The wave absorber includes a processor covering part and an oscillator covering part. The oscillator covering part protrudes from one side of the processor covering part. The processor covering part and the oscillator covering part respectively cover the processor and the oscillator. The blocking sheet is stacked on the oscillator covering part to cover the oscillator. One end of the electrically conductive member is connected to the blocking sheet, and another end of the printed circuit board is connected to the ground connecting portion.

10 Claims, 4 Drawing Sheets

(56) References Cited

U.S. PATENT DOCUMENTS

| | | | |
|---|---|---|---|
| 9,036,367 B2* | 5/2015 | Patil | H04B 1/525 |
| | | | 361/818 |
| 2006/0152913 A1* | 7/2006 | Richey | H05K 9/0024 |
| | | | 361/818 |
| 2007/0273602 A1* | 11/2007 | Zhu | H04B 1/3838 |
| | | | 343/841 |
| 2008/0043452 A1* | 2/2008 | Chen | H05K 9/0032 |
| | | | 361/816 |
| 2009/0296361 A1* | 12/2009 | Huang | H01L 23/552 |
| | | | 361/783 |
| 2012/0050015 A1* | 3/2012 | Low | H04B 5/005 |
| | | | 340/10.1 |
| 2012/0140423 A1* | 6/2012 | Fisher, Jr. | H05K 9/0092 |
| | | | 361/748 |
| 2015/0255702 A1* | 9/2015 | Takebayashi | H05K 9/0024 |
| | | | 310/321 |
| 2017/0085134 A1* | 3/2017 | Jeong | H02J 50/10 |
| 2017/0090532 A1* | 3/2017 | Koukami | H05K 7/20409 |
| 2018/0007818 A1* | 1/2018 | Toleno | H05K 9/003 |

* cited by examiner

NOISE REDUCTION DEVICE AND PRINTED CIRCUIT ASSEMBLY INCLUDING THE SAME

CROSS-REFERENCE TO RELATED APPLICATIONS

This non-provisional application claims priority under 35 U.S.C. § 119(a) on Patent Application No(s). 201710532162.3 filed in China on Jul. 3, 2017, the entire contents of which are hereby incorporated by reference.

TECHNICAL FIELD

The disclosure relates to a noise reduction device and a printed circuit assembly including the same, more particularly to a noise reduction device, which is applicable to an oscillator, and a printed circuit assembly including the same.

BACKGROUND

With the development of diverse portable electronic devices, the portable electronic products can provide many functions to meet various requirements of customers. These portable electronic devices are, for example, notebooks, tablets or smart phones. However, the electronic devices may interfere with each other when being placed close to each other. For example, when using a smart phone near a notebook, radio waves sent by or to the phone interfere with the notebook, causing screen flickering or even the computer to shutdown.

SUMMARY

One embodiment of the disclosure provides a noise reduction device including a wave absorber, a blocking sheet and an electrically conductive member. The wave absorber includes a processor covering part and an oscillator covering part. The oscillator covering part protrudes from one side of the processor covering part. The blocking sheet is stacked on the oscillator covering part. One end of the electrically conductive member is connected to the blocking sheet, and another end of the electrically conductive member is configured to be connected to ground.

One embodiment of the disclosure provides a printed circuit assembly including a printed circuit board, a processor, an oscillator and a noise reduction device. The printed circuit board has a ground connecting portion. The processor is disposed on the printed circuit board. The oscillator is disposed on the printed circuit board. The noise reduction device includes a wave absorber, a blocking sheet and an electrically conductive member. The wave absorber includes a processor covering part and an oscillator covering part. The oscillator covering part protrudes from one side of the processor covering part. The processor covering part and the oscillator covering part respectively cover the processor and the oscillator. The blocking sheet is stacked on the oscillator covering part to cover the oscillator. One end of the electrically conductive member is connected to the blocking sheet, and another end of the printed circuit board is connected to the ground connecting portion.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
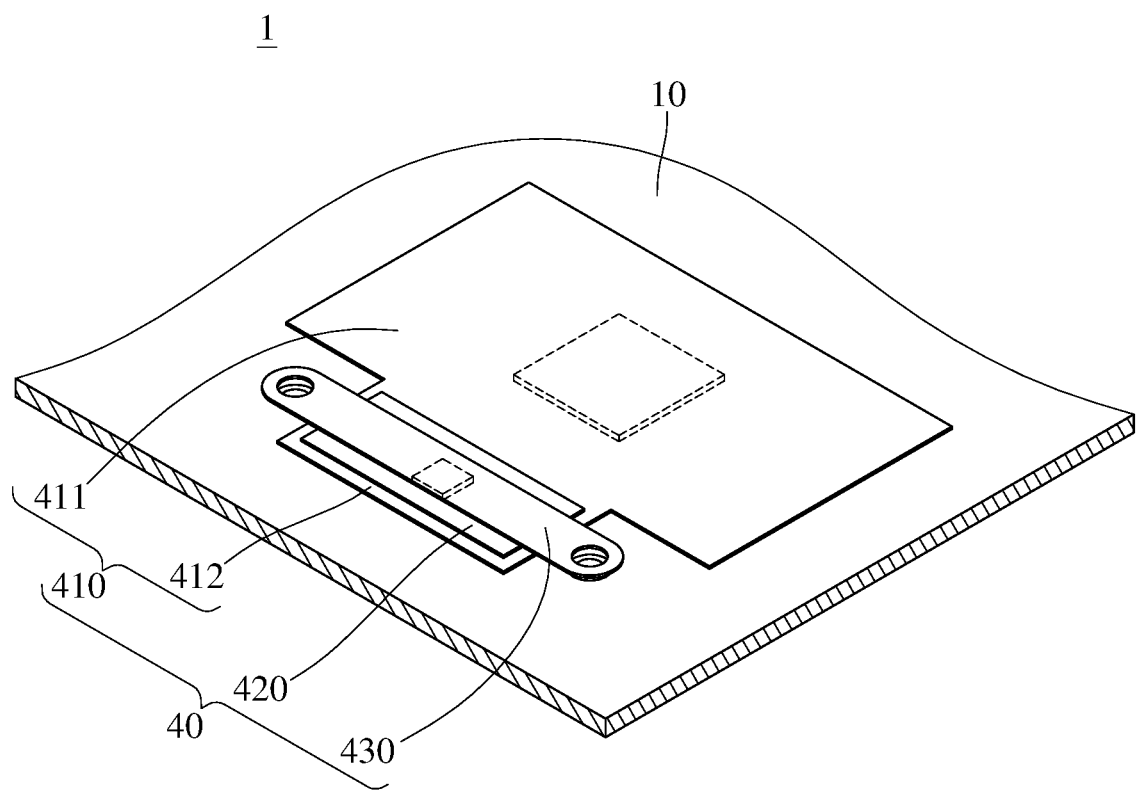
FIG. 1 is a perspective view of a printed circuit assembly including a noise reduction device in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
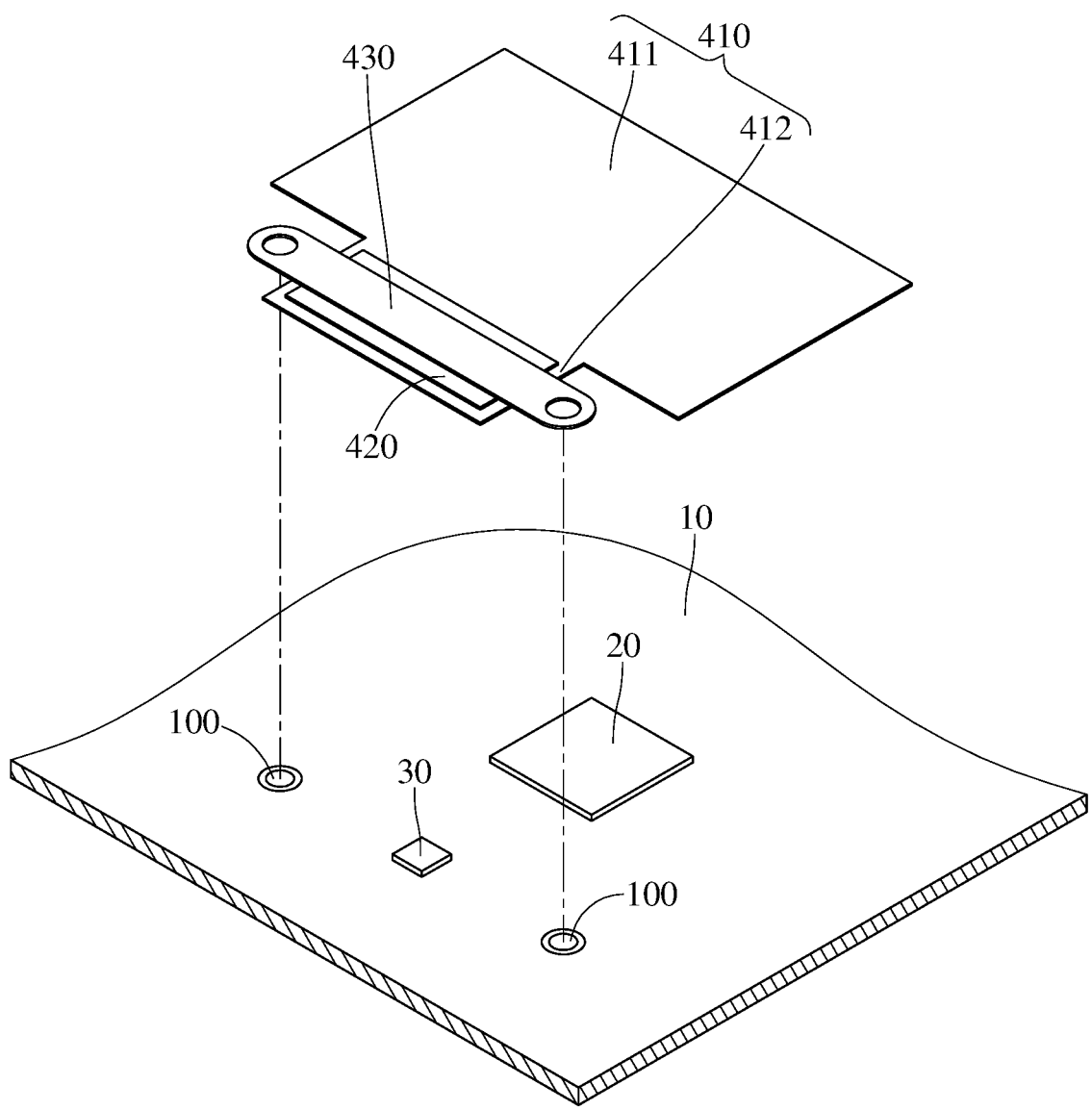
FIG. 2 is a partial exploded view of the printed circuit assembly in FIG. 1.
Figure 3:
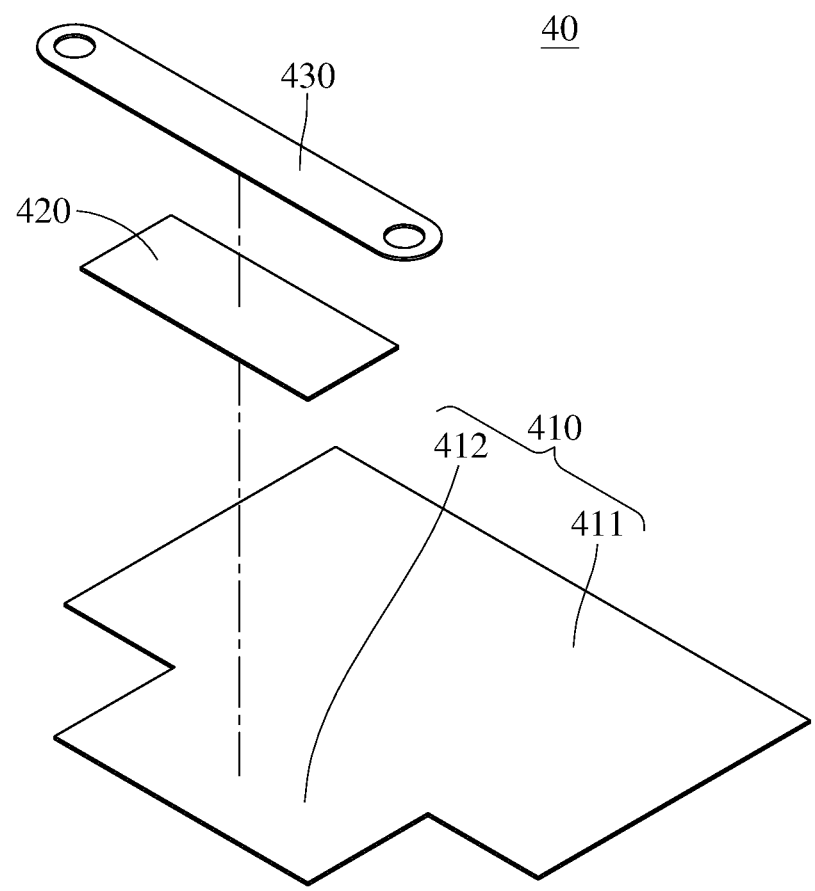
FIG. 3 is an exploded view of the noise reduction device in FIG. 1.

Please refer to FIG. 1 to FIG. 3. FIG. 1 is a perspective view of a printed circuit assembly including a noise reduction device in accordance with one embodiment of the disclosure. FIG. 2 is a partial exploded view of the printed circuit assembly in FIG. 1. FIG. 3 is an exploded view of the noise reduction device in FIG. 1.

In this embodiment, a printed circuit assembly 1 is provided. The printed circuit assembly 1 includes a printed circuit board 10, a processor 20, an oscillator 30 and a noise reduction device 40. As shown in FIG. 2, the printed circuit board 10 includes two ground connecting portions 100, and the processor 20 and the oscillator 30 are disposed on the printed circuit board 10. The processor 20 is, for example, a central processing unit (CPU). The oscillator 30 is, for example, a crystal oscillator, a ceramic oscillator or an RC oscillator (resistor-capacitor oscillator).

As shown in FIG. 3, the noise reduction device 40 includes a wave absorber 410, a blocking sheet 420 and an electrically conductive member 430. The wave absorber 410 includes a processor covering part 411 and an oscillator covering part 412. The oscillator covering part 412 protrudes from one side of the processor covering part 411. The processor covering part 411 and the oscillator covering part 412 respectively cover the processor 20 and the oscillator 30 that are disposed on the printed circuit board 10. The processor covering part 411 and the oscillator covering part 412 are configured to absorb electromagnetic waves transmitted from other electronic devices, such as smart phones. In this embodiment, the processor covering part 411 and the oscillator covering part 412 are formed as one piece, but the present disclosure is not limited thereto. In other embodiments, the processor covering part and the oscillator covering part may be two independent members.

In this embodiment, the wave absorber 410 is made of materials including, but not limited to, a base material and a powdery material. The powder material is mixed in the base material. The base material is, for example, acrylic resin, rubber or silicone. The powdery material is, for example, metallic powder, such as nickel powder or copper powder, which has a high magnetic permeability.

In addition, it is noted that the type of the wave absorber can be changed according to the frequency range of the electromagnetic waves to be absorbed. In this embodiment, the wave absorber 410 is for absorbing electromagnetic waves transmitted to or from smart phones. In general, the frequency of electromagnetic waves transmitted to or from the smart phones ranges from 800 to 1000 megahertz (MHz). Accordingly, in this embodiment, CA180 is adopted as the wave absorber 410, which is capable of effectively absorbing electromagnetic waves with a frequency ranging from 800 to 1000 MHz. However, the present disclosure is not limited to the type of the wave absorber 410. In other embodiments, other type of wave absorber may be adopted for absorbing electromagnetic waves with a different frequency range.

Furthermore, in this embodiment, the wave absorber 410 is electrically insulated, and the wave absorber 410 covers and tightly contacts the processor 20 and the oscillator 30, such that the processor 20 and the oscillator 30 are prevented from being in contact with, for example, a computer casing so as to prevent short circuit.

As shown in FIG. 3, the blocking sheet 420 is stacked on the oscillator covering part 412 to cover the oscillator 30. The electrically conductive member 430 is stacked on the blocking sheet 420, and the electrically conductive member 430 is connected to the blocking sheet 420. Two ends of the electrically conductive member 430 are respectively connected to two ground connecting portions 100 of the printed circuit board 10. It is noted that the present disclosure is not limited to the quantity and the positions of the ground connecting portions. In other embodiments, the printed circuit board may include only one ground connecting portion. In another embodiment, the ground connecting portion may be provided on, for example, the computer casing (not shown).

In this embodiment, the blocking sheet 420 is stacked on the oscillator covering part 412; that is, the oscillator covering part 412 is located between the blocking sheet 420 and the oscillator 30, but the present disclosure is not limited thereto. In other embodiments, the blocking sheet may be located between the oscillator covering part and the oscillator.

In this embodiment, the blocking sheet 420 is, for example, an aluminum foil. The blocking sheet 420 is stacked onto the oscillator covering part 412 in order to improve noise-blocking effect for the oscillator 30, thereby more effectively preventing the oscillator 30 from being interfered with by electromagnetic waves. It is noted that the blocking sheet 420 is not restricted to the aluminum foil. In other embodiments, the blocking sheet 420 may be made of other materials capable of block different kind of noises.

Furthermore, in this embodiment, the electrically conductive member 430 is, for example, an electrically conductive tape. The electrically conductive member 430 is directly stacked on the blocking sheet 420. The two ends of the electrically conductive member 430 are respectively connected to the two ground connecting portions 100 (e.g., exposed copper areas) of the printed circuit board 10 so as to connect the blocking sheet 420 to ground for the purpose of improving the noise-blocking effect.

In this embodiment, the wave absorber 410, the blocking sheet 420 and the electrically conductive member 430 are adhesively attached on the processor 20 and the oscillator 30, but the present disclosure is not limited thereto. In other embodiments, the wave absorber 410, the blocking sheet 420 and the electrically conductive member 430 may be attached on the processor 20 and the oscillator 30 through other ways, such as screwing.

Figure 4:
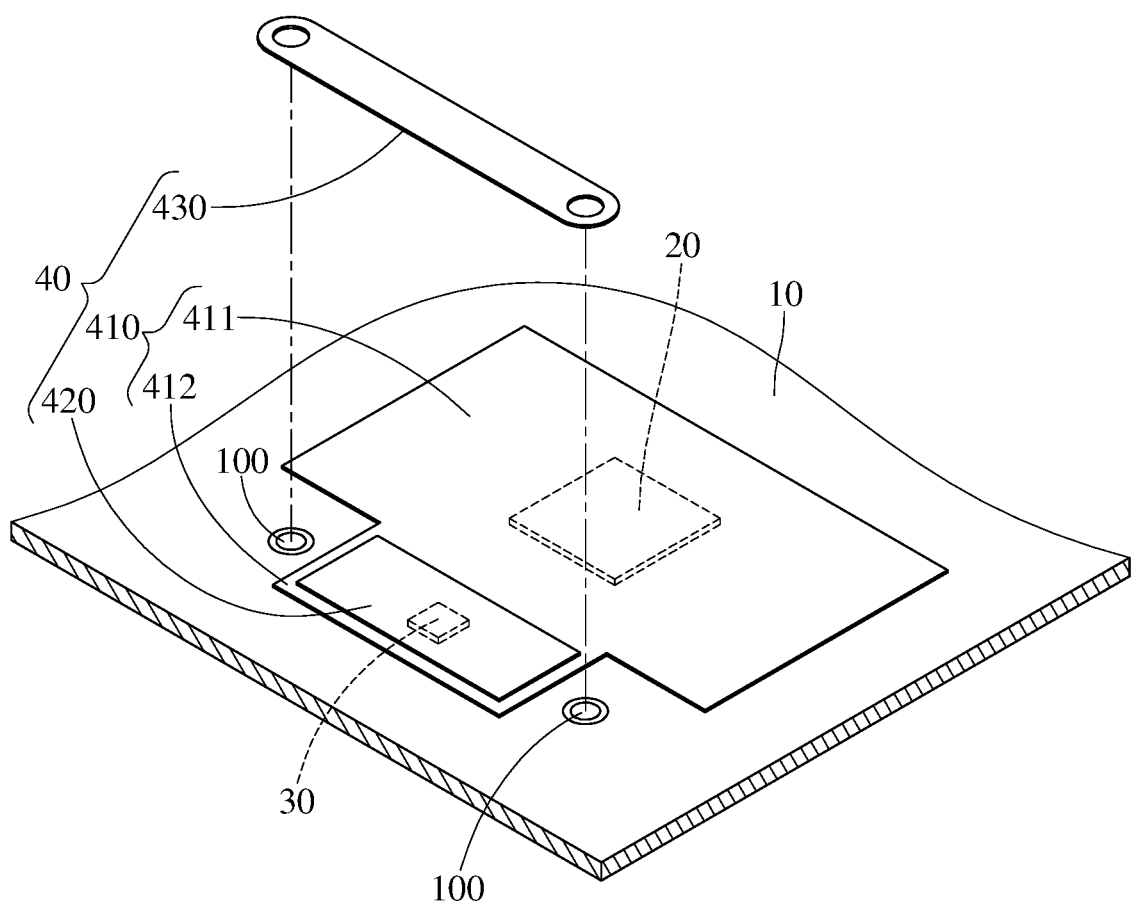
FIG. 4 is another partial exploded view of the printed circuit assembly in FIG. 1.

Please refer to FIG. 4, which is another partial exploded view of the printed circuit assembly in FIG. 1. In this embodiment, the processor 20 is located within edges of the processor covering part 411; that is, the top surface of the processor 20 is entirely covered by the processor covering part 411. The blocking sheet 420 is located within edges of the oscillator covering part 412, and the oscillator 30 is located within the edges of the oscillator covering part 412 and also within edges of the blocking sheet 420; that is, the top surface of the oscillator 30 is entirely covered by the oscillator covering part 412 and the blocking sheet 420. As a result, the processor 20 and the oscillator 30 are protected from electromagnetic waves.

In addition, in this embodiment, a distance between the edges of the blocking sheet 420 and the edges of the oscillator covering part 412 ranging between 0.5 to 3 millimeters (mm) is used to prevent the blocking sheet 420 from accidentally contacting other electronic components (not shown) on the printed circuit board 10, thereby preventing the blocking sheet 420 from short circuit. However, the present disclosure is not limited to the distance range between the edges of the blocking sheet 420 and edges of the oscillator covering part 412. In other embodiments, the distance range between the edges of the blocking sheet 420 and the edges of the oscillator covering part 412 may be larger; that is, the area of the blocking sheet 420 may be smaller, or the area of the oscillator covering part 412 may be larger as long as the oscillator 30 is ensured to be entirely covered by the blocking sheet 420.

In this embodiment or other embodiments, when the noise reduction device 40 is applied to an electronic product, its thickness should be taken into consideration to allow it to be fitted into a limited space between the printed circuit board 10 and a casing (not shown) of the product. For example, when a distance between the printed circuit board 10 and the casing is 0.1 centimeter, the ideal wave absorber should have a thickness less than 0.1 centimeter, i.e., the aforementioned CA180.

In contrast, when a conventional insulator, such as Mylar, is placed between the printed circuit board 10 and the casing, it is not effective in blocking electromagnetic waves because Mylar is made of a single material and insufficient in thickness. That is, the electronic product may still be interfered with by electromagnetic waves, and thereby causing screen flickering.

Therefore, since the noise reduction device 40, in this embodiment, is composed of a wave-absorbing material, an aluminum foil and an electrically conductive material, the noise reduction device 40 would have multiple protections to block electromagnetic waves so as to substantially suppress the interference. However, the thickness of the aforementioned insulator would be larger than that of the noise reduction device 40 in order to achieve the same noise-blocking effect. In other words, when the noise reduction device 40 and the insulator are the same in thickness, the interference suppression effect provided by the noise reduction device 40 is way better than the insulator. Therefore, the thickness of the noise reduction device 40 can be small, such that the noise reduction device 40 is able to be fitted into a narrow space between a printed circuit board and a casing of an electronic product without mechanical interference.

Moreover, the wave absorber 410 is electrically insulated, meaning the wave absorber 410 is capable of absorbing electromagnetic waves and preventing short circuit between the processor 20 and the oscillator 30 against the computer casing, so there is no need to provide additional insulator in the noise reduction device 40; that is, it is beneficial to reduce the thickness of the noise reduction device 40.

According to the noise reduction device and the printed circuit assembly as described above, the interference suppression effect is achieved by covering the processor and the oscillator with the wave absorber, and additionally, covering the oscillator with the blocking sheet. Furthermore, the noise blocking effect is improved by connecting the blocking sheet to ground via the electrically conductive member, thereby achieving the purpose of blocking electromagnetic waves. Moreover, since the wave absorber is electrically insulated, it is possible to prevent the processor and the oscillator from accidentally in contact with the computer casing, thereby preventing short circuit. Accordingly, the processor and the oscillator of the printed circuit assembly are prevented from being interfered with by electromagnetic waves, and it would have no mechanical interference when applying the noise reduction device to an electronic product having a limited accommodating space between its printed circuit board and casing.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A noise reduction device, comprising:
   a wave absorber, comprising a processor covering part and an oscillator covering part, and the oscillator covering part protruding from one side of the processor covering part;
   a blocking sheet, stacked on the oscillator covering part; and
   an electrically conductive member, one end of the electrically conductive member connected to the blocking sheet, and another end of the electrically conductive member configured to be connected to ground.

2. The noise reduction device according to claim 1, wherein the wave absorber absorbs electromagnetic waves with a frequency ranging from 800 to 1000 megahertz (MHz).

3. The noise reduction device according to claim 1, wherein the wave absorber is electrically insulated.

4. The noise reduction device according to claim 1, wherein the blocking sheet is an aluminum foil.

5. The noise reduction device according to claim 1, wherein the blocking sheet is located within edges of the oscillator covering part.

6. The noise reduction device according to claim 5, wherein a distance between edges of the blocking sheet and the edges of the oscillator covering part ranges between 0.5 to 3 millimeters (mm).

7. A printed circuit assembly, comprising:
   a printed circuit board, having a ground connecting portion;
   a processor, disposed on the printed circuit board;
   an oscillator, disposed on the printed circuit board; and
   a noise reduction device, comprising a wave absorber, a blocking sheet and an electrically conductive member, the wave absorber comprising a processor covering part and a oscillator covering part, the oscillator covering part protruding from one side of the processor covering part, the processor covering part and the oscillator covering part respectively covering the processor and the oscillator, the blocking sheet being stacked on the oscillator covering part to cover the oscillator, one end of the electrically conductive member being connected to the blocking sheet, and another end of the printed circuit board being connected to the ground connecting portion.

8. The printed circuit assembly according to claim 7, wherein the processor is located within edges of the processor covering part.

9. The printed circuit assembly according to claim 7, wherein the oscillator is located within edges of the oscillator covering part.

10. The printed circuit assembly according to claim 7, wherein the oscillator is located within edges of the blocking sheet.

* * * * *